United States Patent
Schaller et al.

(10) Patent No.: US 11,726,148 B2
(45) Date of Patent: Aug. 15, 2023

(54) SENSOR DEVICES HAVING SOFT MAGNETS AND ASSOCIATED PRODUCTION METHODS

(71) Applicant: Infineon Technologies AG, Neubiberg (DE)

(72) Inventors: Rainer Markus Schaller, Saal an der Donau (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/836,204

(22) Filed: Jun. 9, 2022

(65) Prior Publication Data

US 2022/0397617 A1 Dec. 15, 2022

(30) Foreign Application Priority Data

Jun. 10, 2021 (DE) .......................... 102021114943.6

(51) Int. Cl.
  *G01R 33/07* (2006.01)
  *G01R 15/20* (2006.01)
(52) U.S. Cl.
  CPC ........... *G01R 33/07* (2013.01); *G01R 15/202* (2013.01)
(58) Field of Classification Search
  CPC combination set(s) only.
  See application file for complete search history.

(56) References Cited

U.S. PATENT DOCUMENTS

| | | | |
|---|---|---|---|
| 6,989,665 B2 | 1/2006 | Goto | |
| 10,598,743 B2* | 3/2020 | Xue | .......................... G07D 7/20 |
| 2004/0080307 A1 | 4/2004 | Ohtsuka | |
| 2004/0080308 A1 | 4/2004 | Goto | |
| 2005/0030018 A1 | 2/2005 | Shibahara et al. | |
| 2006/0175674 A1 | 8/2006 | Taylor et al. | |
| 2007/0145972 A1* | 6/2007 | Auburger | .............. G01P 15/105 |
| | | | 324/252 |
| 2007/0279053 A1 | 12/2007 | Taylor et al. | |
| 2009/0027047 A1 | 1/2009 | Kinzel | |
| 2009/0072875 A1* | 3/2009 | Tarng | .................... H03L 7/1976 |
| | | | 327/306 |
| 2009/0295384 A1 | 12/2009 | Teppan | |
| 2010/0141249 A1 | 6/2010 | Ararao et al. | |

(Continued)

FOREIGN PATENT DOCUMENTS

DE 102007006219 A1 8/2008
DE 112009003555 T5 8/2012

(Continued)

*Primary Examiner* — Alvaro E Fortich
(74) *Attorney, Agent, or Firm* — Harrity & Harrity, LLP

(57) ABSTRACT

A sensor device includes a current conductor designed to carry a measurement current, and a magnetic field sensor chip having a sensor element, wherein the magnetic field sensor chip is designed to detect a magnetic field at the location of the sensor element. The sensor device furthermore includes an encapsulation material, wherein the magnetic field sensor chip is encapsulated by the encapsulation material, and a soft magnet secured to the encapsulation material and designed to concentrate the magnetic field at the location of the sensor element. The magnetic field sensor chip and the soft magnet are galvanically isolated from one another by the encapsulation material.

20 Claims, 4 Drawing Sheets

(56) References Cited

U.S. PATENT DOCUMENTS

| | | | |
|---|---|---|---|
| 2013/0249029 A1 | 9/2013 | Vig et al. | |
| 2013/0249544 A1* | 9/2013 | Vig | G01R 33/0011 324/252 |
| 2017/0222131 A1 | 8/2017 | Chew et al. | |
| 2022/0059261 A1* | 2/2022 | Lacroix | H01F 1/0551 |

FOREIGN PATENT DOCUMENTS

| | | |
|---|---|---|
| EP | 3029470 A4 | 8/2016 |
| JP | 6506247 B2 | 4/2019 |
| WO | 2014036731 A1 | 3/2014 |

* cited by examiner

SENSOR DEVICES HAVING SOFT MAGNETS AND ASSOCIATED PRODUCTION METHODS

RELATED APPLICATION

This application claims priority to German Patent Application No. 102021114943.6 filed on Jun. 10, 2021, which is incorporated herein by reference in its entirety.

FIELD

The present disclosure relates to sensor devices having soft magnets and to associated production methods.

BACKGROUND

In sensor devices, sensor chips may be configured to detect the magnetic fields induced by an electric current flowing through a current conductor. Measurement concepts used in this context may or may not use a magnetic core. The sensor chip can be positioned relatively flexibly in the case of core-based measurement concepts. However, core-based solutions may also entail some disadvantages, such as, for example, hysteresis effects or cost-intensive housings. Manufacturers of sensor devices constantly endeavor to improve their products and associated production methods. In particular, it may be desirable to provide sensor devices which yield accurate measurements and at the same time can be implemented cost-effectively.

SUMMARY

Various aspects relate to a sensor device. The sensor device includes a current conductor configured to carry a measurement current. The sensor device furthermore includes a magnetic field sensor chip having a sensor element, wherein the magnetic field sensor chip is configured to detect a magnetic field at the location of the sensor element. The sensor device furthermore includes an encapsulation material, wherein the magnetic field sensor chip is encapsulated by the encapsulation material. The sensor device furthermore includes a soft magnet secured to the encapsulation material and configured to concentrate the magnetic field at the location of the sensor element. The magnetic field sensor chip and the soft magnet are galvanically isolated from one another by the encapsulation material.

Various aspects relate to a method for producing a sensor device. The method includes providing a current conductor configured to carry a measurement current. The method furthermore includes providing a magnetic field sensor chip having a sensor element, wherein the magnetic field sensor chip is configured to detect a magnetic field at the location of the sensor element. The method furthermore includes encapsulating the magnetic field sensor chip by an encapsulation material. The method furthermore includes fabricating and securing a soft magnet to the encapsulation material, wherein the soft magnet is configured to concentrate the magnetic field at the location of the sensor element. The magnetic field sensor chip and the soft magnet are galvanically isolated from one another by the encapsulation material.

BRIEF DESCRIPTION OF THE DRAWINGS

Sensor devices and methods for producing them in accordance with the disclosure are explained in greater detail below with reference to drawings. Identical reference signs may designate identical components.

DETAILED DESCRIPTION

Figure 1A:
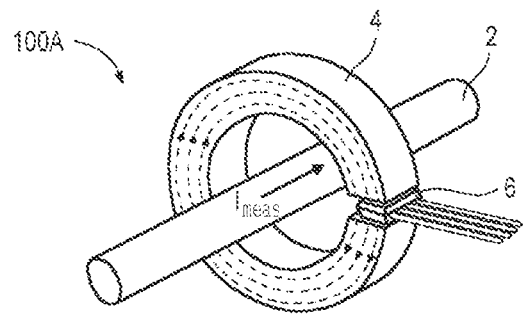
FIG. 1A shows a sensor device 100A based on a core-based open-loop measurement concept.

The sensor device 100A in FIG. 1A can be based on a core-based open-loop measurement concept. The sensor device 100A can have a current conductor or a busbar 2, a magnetic flux concentrator or a magnetic core 4 and a magnetic field sensor chip 6. The current conductor 2 can be configured to carry a measurement current $I_{meas}$, the intensity of which is intended to be determined by the sensor device 100A. In the example in FIG. 1A, the magnetic flux concentrator 4 can be formed in a ring-shaped fashion, and the current conductor 2 can extend through the opening in the ring core. The ring-shaped course of the magnetic flux concentrator 4 can be interrupted at a location and form a gap. The magnetic field sensor chip 6 can be arranged in this gap.

The measurement current $I_{meas}$ can generate a magnetic field around the current conductor 2. The field lines of the magnetic field generated in the magnetic flux concentrator 4 are indicated by circular dashed arrows in FIG. 1A. The magnetic field sensor chip 6 can have at least one sensor element (not shown) and can be configured to detect the magnetic field at the location of the sensor element. The magnetic flux concentrator 4 can be configured to concentrate the magnetic field generated by the current conductor 2 at the location of the sensor element. The detected magnetic field can be converted into a measurement signal or a measurement voltage by the magnetic field sensor chip 6. The measurement signal can be proportional to the measurement current $I_{meas}$. The intensity of the measurement current $I_{meas}$ can be deduced from the intensity of the measurement signal.

Figure 1B:
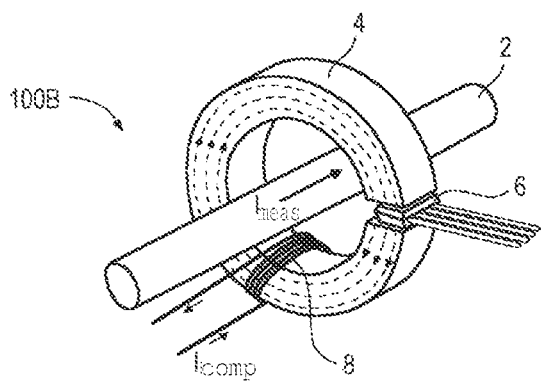
FIG. 1B shows a sensor device 100B based on a core-based closed-loop measurement concept.

The sensor device 100B in FIG. 1B can be based on a core-based closed-loop measurement concept. The sensor device 100B can be partly similar to the sensor device 100A in FIG. 1A and have similar components. In contrast to FIG. 1A, the sensor device 100B can have a compensation coil 8 wound in particular multiply around the magnetic flux concentrator 4. The compensation coil 8 can be configured to carry a compensation current $I_{comp}$. The intensity of the compensation current $I_{comp}$ can be actively controlled in order to generate a magnetic field that is opposite to the magnetic field generated by the measurement current $I_{meas}$. The intensity of the compensation current $I_{comp}$ can be proportional to the intensity of the measurement current $I_{meas}$, such that the intensity of the measurement current $I_{meas}$ can be deduced from the intensity of the compensation current $I_{comp}$.

Figure 2A:
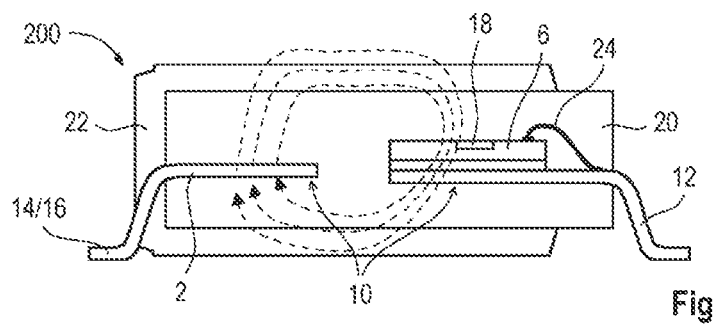
FIGS. 2A and 2B show a cross-sectional side view and a plan view, respectively, of a sensor device 200 in accordance with the disclosure.
Figure 2B:
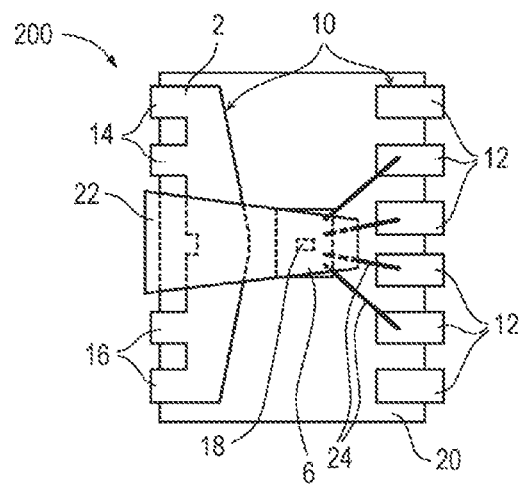

FIGS. 2A and 2B show a cross-sectional side view and a plan view, respectively, of a sensor device 200 in accordance with the disclosure. The sensor device 200 can be similar to the sensor devices described above and have similar components and properties. The sensor device 200 can have an electrically conductive chip carrier 10 having a current conductor 2 in the form of a busbar and a plurality of connection conductors 12. The current conductor 2 can have one or a plurality of first connections 14 and also one or a plurality of second connections 16, at which an electric measurement current can be fed into the current conductor 2 and output. A magnetic field sensor chip 6 having at least one sensor element 18 can be arranged on the chip carrier 10. The magnetic field sensor chip 6 or its sensor element 18 can be configured to detect magnetic fields. The components of the sensor device 200 can be at least partly encapsulated by an encapsulation material 20. A soft magnet 22 can be secured to the encapsulation material 20.

The magnetic field sensor chip 6 can be an integrated circuit, and so this may also be referred to as a magnetic field sensor IC. In the example in FIGS. 2A and 2B, the magnetic field sensor chip 6 can be in particular a Hall sensor or a Hall IC. In further examples, the magnetic field sensor chip 6 can be an xMR sensor, in particular an AMR sensor, a GMR sensor or a TMR sensor. In the case of a Hall sensor, the sensor element 18 can be a Hall element or a Hall sensor element, which can be integrated into the circuit. Furthermore, signal amplification, analog-to-digital conversion, digital signal processing and/or offset and temperature compensation can be effected in the Hall IC. Besides the Hall plates, the components for the signal amplification and/or the analog-to-digital conversion may or may not be regarded as part of the sensor element 18.

The sensor element 18 can be designed in particular to detect an absolute magnetic field strength of a magnetic field at the location of the sensor element 18. In this case, the sensor element 18 can detect both the absolute value of the detected magnetic field and the sign, i.e. the direction, of the magnetic field. The absolute magnetic field strength can be detected in at least one sensitivity direction or in a sensitivity plane of the sensor element 18. By way of example, the sensor element 18 in FIG. 2A can be sensitive in a perpendicular direction or in a direction perpendicular to the top side of the magnetic field sensor chip 6.

The chip carrier 10 can be for example a leadframe that forms the busbar 2 and the connection conductors 12. The leadframe can be fabricated from copper, nickel, aluminum or high-grade steel, for example. The magnetic field sensor chip 6 can be electrically connected to the connection conductors 12 via one or a plurality of electrical connecting elements 24. The connection conductors 12 can thus also be referred to as sensor connections or sensor pins. Four electrical connecting elements 24 in the form of bond wires are shown by way of example in FIG. 2B. In further examples, the electrical connecting elements 24 can be embodied differently, for example as clips or tapes, and their number can differ from the example in FIG. 2B.

One or a plurality of the device components can be embedded into the encapsulation material 20 and thereby protected against external influences, such as dirt or moisture. In other words, the encapsulation material 20 can form a housing for the components of the sensor device 200, such that the sensor device 200 can also be referred to as a sensor package. In the example in FIGS. 2A and 2B, in particular the current conductor 2 and the magnetic field sensor chip 6 can be encapsulated by the encapsulation material 20. The magnetic field sensor chip 6 and the sensor element 18 can be galvanically isolated from the current conductor 2 and the soft magnet 22 by the encapsulation material 20.

The encapsulation material 20 can be fabricated for example from a laminate, an epoxy resin, a thermoplastic, a thermosetting polymer, etc. In the example in FIGS. 2A and 2B, the encapsulation material 20 can be fabricated by means of a molding process, in particular. The connection conductors 12 and the connections 14, 16 can be at least partly not covered by the encapsulation material 20. Consequently, the current conductor 2 and the magnetic field sensor chip 6 can be electrically contacted from outside the encapsulation material 20. The sensor device 200 can be mounted by way of the connection conductors 12 and the connections 14, 16 for example on a circuit board (not shown) and can be electrically connected thereto.

The soft magnet 22 can comprise a polymer-based material and soft-magnetic filler particles embedded therein. The polymer-based material can be electrically insulating. The polymer-based material can be for example one or more from a polymer resin, an epoxy, a thermosetting plastic material, a thermoplastic material, etc. The soft-magnetic filler particles can be one or more from nickel (Ni) particles, iron (Fe) particles, iron-nickel (FeNi) particles, iron-silicon (FeSi) particles, iron-silicon-boron (FeSiB) particles, iron-cobalt (FeCo) particles, mu-metal particles, etc. The soft-magnetic filler particles can be configured to be magnetized in a magnetic field, but need not necessarily remain magnetized when the magnetic field is removed.

The soft magnet 22 can be fabricated and secured to the encapsulation material 20 in various ways. In one example, the soft magnet 22 can be secured to the encapsulation material 20 by means of an adhesive material, such as an adhesive, for example. Alternatively or additionally, the soft magnet 22 can be fabricated by means of a molding process in a further example. In this case, the molding process can comprise one or more from the following: injection molding of a thermoplastic material, compression molding a thermoplastic material, transfer molding of a thermosetting plastic material, etc. In one example, firstly the encapsulation material 20 can be fabricated by means of a first molding process and then the soft magnet 22 can be formed over the encapsulation material 20 by means of a second molding process.

The different views in FIGS. 2A and 2B reveal that, in the example shown, the soft magnet 22 can be formed in a u-shaped fashion over three sides of the encapsulation material 20. In this case, the soft magnet 22 can have the form of a clip arranged around the encapsulation material 20. In further examples, the soft magnet 22 can also be formed over more than three sides of the encapsulation material 20.

Operation of the sensor device 200 can be based on a core-based open-loop measurement concept as described in association with FIG. 1A. In this case, the soft magnet 22 can have the function of the magnetic flux concentrator 4 in FIG. 1A. During operation of the sensor device 200, a measurement current can be fed into the busbar 2 at the first connection 14. The measurement current can flow through the busbar 2 and leave the busbar 2 at the second connection 16. The measurement current can generate a magnetic field, which can be detected by the magnetic field sensor chip 6 at the location of the sensor element 18. The intensity of the measurement current can be deduced from the intensity of the measurement signal output by the magnetic field sensor chip 6. The soft magnet 22 can be configured to homogenize the magnetic field generated by the measurement current and to concentrate it at the location of the sensor element 18.

The following technical effects, inter alia, can be provided by the sensor device 200. The same can also apply to all further sensor devices described herein in accordance with the disclosure.

The soft magnet 22 can act as a magnetic flux concentrator in the sensor device 200. An effect of the soft magnet 22 on the magnetic field generated by the measurement current is indicated by deformed dashed magnetic field lines in FIG. 2A. The soft magnet 22 can homogenize the magnetic field generated by the measurement current at the location of the sensor element 18 and the relatively close vicinity thereof. Furthermore, the soft magnet 22 can suppress undesired magnetic stray fields at the location of the sensor element 18 and the relatively close vicinity thereof. A higher measurement accuracy of the sensor device 200 can be provided as a result of the described modes of action of the soft magnet 22.

Differential magnetic field measurements can be used to avoid undesired influences of magnetic stray fields on the measurement. A differential magnetic field measurement can presuppose oppositely oriented magnetic fields at the locations of the sensor elements of a differential magnetic field sensor chip used. This can result in geometric restrictions inter alia for the relative arrangement of the magnetic field sensor chip and the current conductor. Since the soft magnet 22 can already effectively suppress an influence of undesired magnetic stray fields, a differential magnetic field measurement can be dispensed with in the sensor device 200. Instead, the sensor element 18 of the magnetic field sensor chip 6 can be configured to detect an absolute magnetic field strength. Therefore, the design of the sensor device 200 need not necessarily be restricted by the geometric conditions of a differential magnetic field measurement.

In the sensor device 200, the current conductor 2 and the magnetic field sensor chip 6 having the sensor element 18 can be galvanically isolated from one another by the encapsulation material 20 arranged between them. The encapsulation material 20 can thus increase a DTI (Distance Through Insulation). The galvanic isolation provided makes it possible to reduce a distance between the sensor element 18 and the current conductor 2 and to optimize the magnetic signal at the location of the sensor element 18. A higher measurement accuracy of the sensor device 200 can be provided as a result.

In the sensor device 200 the current conductor 2 can be formed substantially rectilinearly with a low ohmic resistance. A high current-carrying capacity of the current conductor 2 can be provided as a result.

Figure 3:
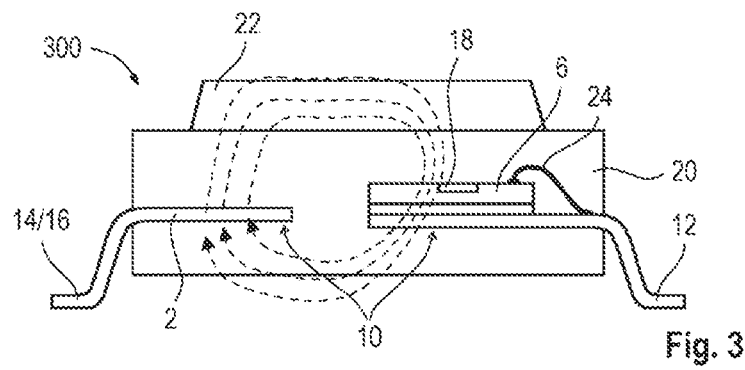
FIG. 3 shows a cross-sectional side view of a sensor device 300 in accordance with the disclosure.

The sensor device 300 in FIG. 3 can be at least partly similar to the sensor device 200 in FIGS. 2A and 2B and have similar components and properties. In contrast to FIGS. 2A and 2B, the soft magnet 22 of the sensor device 300 can be formed over a single side of the encapsulation material 20. In FIG. 3, the soft magnet 22 is arranged by way of example over the top side of the encapsulation material 20. In further examples, the soft magnet 22 can be arranged over a different side of the encapsulation material 20, for example over the underside of the encapsulation material 20. The similar course of the dashed magnetic field lines in FIGS. 2A and 3 reveals that the soft magnet 22 can have a similar effect on the magnetic field in both examples.

Figure 4:
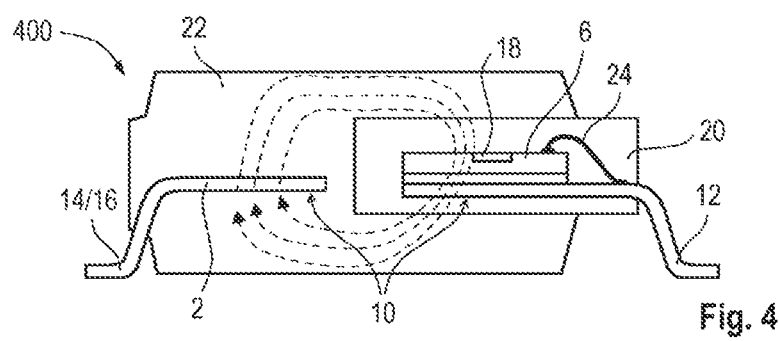
FIG. 4 shows a cross-sectional side view of a sensor device 400 in accordance with the disclosure.

The sensor device 400 in FIG. 4 can be at least partly similar to the sensor devices in preceding figures and have similar components and properties. In FIG. 4, the current conductor 2 can be encapsulated by the soft magnet 22. In comparison with FIGS. 2A and 2B, the soft magnet 22 in FIG. 4 can have larger dimensions and the encapsulation material 20 can have smaller dimensions. Analogously to FIGS. 2A and 2B, the soft magnet 22 in FIG. 4 can be formed in a u-shaped fashion over three sides of the encapsulation material 20.

Figure 5:
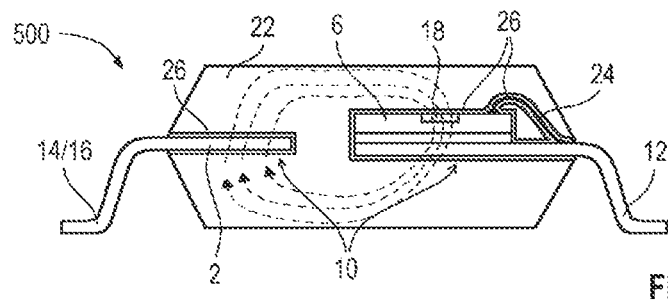
FIG. 5 shows a cross-sectional side view of a sensor device 500 in accordance with the disclosure.

The sensor device 500 in FIG. 5 can be at least partly similar to the sensor devices in preceding figures and have similar components and properties. In the example in FIG. 5, the function of the encapsulation material 20 in preceding figures can be provided by a conformal polymer-based coating 26 formed on the magnetic field sensor chip 6. The coating 26 can additionally be arranged over the current conductor 2, the electrical connecting elements 24 and/or the connection conductors 12. In other words, the coating 26 can at least partly encapsulate components of the sensor device 500. The coating 26 can provide in particular an electrical insulation described in association with the preceding figures. In one example, the conformal polymer-based coating 26 can comprise parylene. A thickness of the coating 26 can be substantially identical at all points. The thickness of the coating 26 can lie in a range of approximately 10 nanometers to approximately 500 micrometers, or of approximately 100 nanometers to approximately 100 micrometers, or of approximately 1 micrometer to approximately 30 micrometers.

The conformal polymer-based coating 26 can be fabricated in any suitable way. In one example, the polymer-based material of the coating 26 can be deposited from the vapor phase. During the production of the sensor device 500, before the soft magnet 22 is fabricated, firstly all components can be coated with the polymer-based material. The soft magnet 22 can then be formed by means of a molding process, for example. After the molding process, the coating 26 can be removed from the connection conductors 12 and connections 14, 16 projecting from the soft magnet 22.

Figure 6:
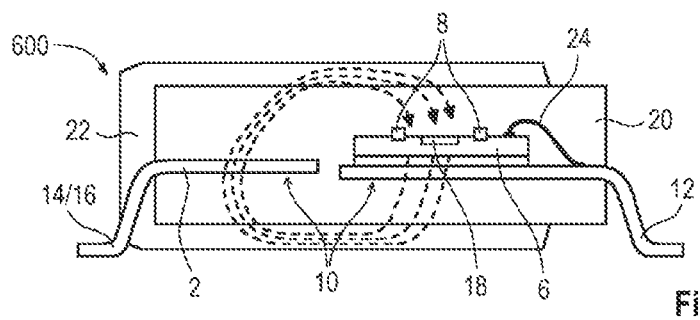
FIG. 6 shows a cross-sectional side view of a sensor device 600 in accordance with the disclosure.

The sensor device 600 in FIG. 6 can be at least partly similar to the sensor device 200 in FIGS. 2A and 2B and have similar components and properties. Operation of the sensor device 600 can be based on a core-based closed-loop measurement concept as described in FIG. 1B. In this context, in comparison with FIGS. 2A and 2B, the sensor device 600 can additionally have a coil or compensation coil 8 formed around the sensor element 18. The coil 8 in FIG. 6 can have the function of the compensation coil 8 in FIG. 1B and can be configured to carry a compensation current. The magnetic field induced by the compensation current can compensate for the magnetic field induced by the measurement current at the location of the sensor element 18. In order to achieve this, the compensation current can be controlled or readjusted by the sensor device 600 in a suitable manner. The control of the compensation current can be carried out by an ASIC circuit, for example, which can be integrated into the magnetic field sensor chip 6 or can be embodied in a separate chip (not shown). The compensation current can be proportional to the measurement current and the sensor device 600 can be configured to determine the measurement current based on the compensation current.

The coil 8 can be fabricated from a nonmagnetic or only weakly magnetic material. By way of example, the coil can be produced from copper and/or aluminum. In the example in FIG. 6, the sensor element 18 can be arranged on a surface of the magnetic field sensor chip 6 facing away from the chip carrier 10. Accordingly, the coil 8 can also be formed at the top side of the magnetic field sensor chip 6. The coil 8 can be formed for example in a metallization layer arranged at a surface of the magnetic field sensor chip 6. The metallization layer can be for example a redistribution layer of the magnetic field sensor chip 6.

In a further example, the sensor element 18 and the coil 8 can be arranged at the underside of the magnetic field sensor chip 6 facing the electrically conductive chip carrier 10. In this case, too, the coil 8 can be formed for example in a metallization layer of the magnetic field sensor chip 6. Alternatively, or additionally, the coil 8 can be formed in the electrically conductive chip carrier 10, for example by means of one or more from: mechanical sawing, application of a laser beam, cutting, stamping, milling, etching, etc. In this case, the chip carrier 10 can be fabricated from a nonmagnetic or only weakly magnetic material and correspond to a leadframe, for example.

Figure 7:
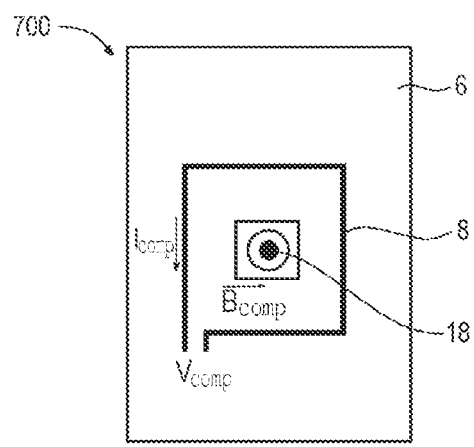
FIG. 7 shows a plan view of a sensor device 700 in accordance with the disclosure.

The sensor device 700 in FIG. 7 can be at least partly similar to the sensor device 600 in FIG. 6 and have similar components and properties. FIG. 7 can correspond in particular to an excerpt from a plan view of the sensor device 600 in FIG. 6. FIG. 7 shows a coil 8 formed around a sensor element 18, to which coil a compensation voltage $V_{comp}$ can be applied and which coil can be configured to carry a compensation current $I_{comp}$. A compensation magnetic field $B_{comp}$ can be generated by the compensation current $I_{comp}$.

The sum of the compensation magnetic field $B_{comp}$ and the magnetic field $B_{meas}$ generated by the measurement current $I_{meas}$ produces a resultant magnetic field $B_{res}$. The voltage $V_{comp}$ applied to the coil 8 can be set such that the resultant magnetic field $B_{res}$ becomes zero, i.e. the equation $$B_{res} = B_{comp} + B_{meas} = 0 \quad (1)$$

is satisfied. Equation (1) yields the condition $$B_{comp} = -B_{meas}. \quad (2)$$

Since $B_{comp} \sim I_{comp}$ can hold true, the following relation arises, from which the measurement current can be deduced:

$$I_{comp} \sim -B_{meas} \sim I_{meas}. \quad (3)$$

In the example in FIG. 7, the coil 8 can be formed in a substantially rectangular fashion. In further examples, the coil 8 can have a different shape extending around the sensor element 18 and can be formed in a circular or elliptic fashion, for example. In the example in FIG. 7, the coil 8 can have a single turn. In further examples, the coil 8 can have a plurality of turns. The number of turns of the coil 8 can assume an arbitrary value from 1 to 10, for example. A half-integral number of turns is also possible.

The coil 8 used in the sensor devices 600 and 700 in FIGS. 6 and 7 can optionally also be used in all other sensor devices described above in accordance with the disclosure. A use of the coil 8 makes it possible to prevent hysteresis effects and to provide a higher measurement accuracy of the respective sensor device in accordance with the disclosure.

The sensor devices described in the preceding examples can have further technical features. In one example, the chip carrier 10 can have structures that suppress eddy currents, as a result of which noise reduction can be provided. Particularly in the case of AC currents having relatively high frequencies, eddy currents can be generated in the chip carrier 10. The intensity of the magnetic field strengths detected by the sensor element 18 can be altered, in particular reduced, by the eddy currents generated. In other words, the sensor element 18 cannot accurately detect the strength of the magnetic field on account of the eddy currents generated. Structures of the chip carrier 10 that suppress eddy currents enable eddy currents to be prevented or at least reduced. By way of example, the chip carrier 10 can have one or a plurality of notches or incisions that can interrupt a typical profile of the eddy currents.

Figure 8:
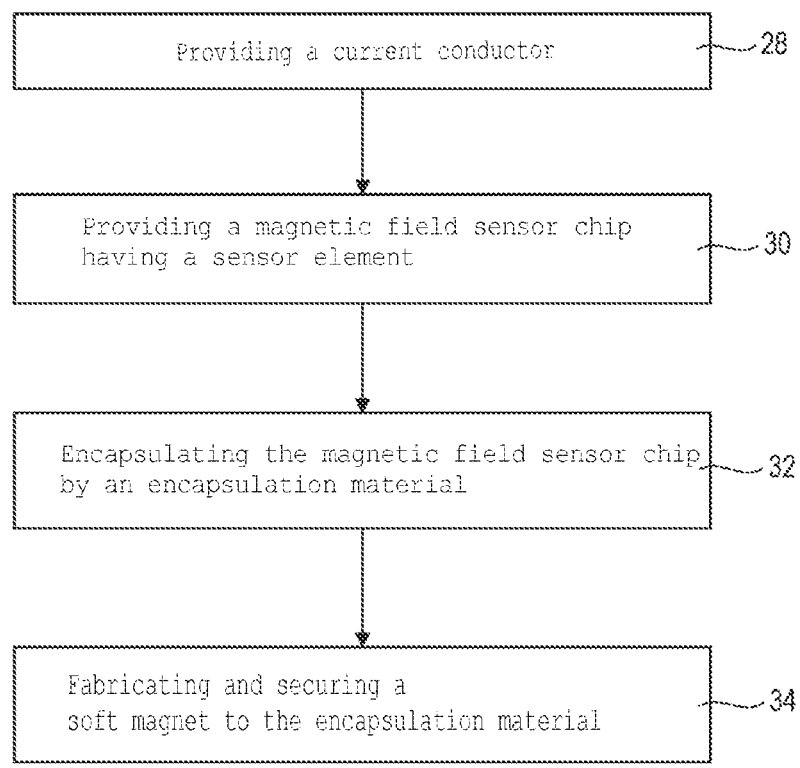
FIG. 8 shows a flow diagram of a method for producing a sensor device in accordance with the disclosure.

FIG. 8 shows a flow diagram of a method for producing a sensor device in accordance with the disclosure. The method can be used for example to fabricate any of the sensor devices described herein in accordance with the disclosure. The method can thus be read in conjunction with any of the preceding figures.

At 28 a current conductor can be provided, which is configured to carry a measurement current. At 30 a magnetic field sensor chip having a sensor element can be provided, wherein the magnetic field sensor chip is configured to detect a magnetic field at the location of the sensor element. At 32 the magnetic field sensor chip can be encapsulated by an encapsulation material. At 34 a soft magnet can be fabricated and secured to the encapsulation material, wherein the soft magnet is configured to concentrate the magnetic field at the location of the sensor element. The magnetic field sensor chip and the soft magnet can be galvanically isolated from one another by the encapsulation material.

The method in FIG. 8 can have further optional steps, which are not described in detail for the sake of simplicity. By way of example, fabricating the soft magnet can comprise at least one of the following actions: injection molding of a thermoplastic material, compression molding of a thermoplastic material, or transfer molding of a thermosetting plastic material. Furthermore, securing the soft magnet to the encapsulation material can include adhesively bonding the soft magnet to the encapsulation material.

EXAMPLES

Sensor devices and methods for producing them in accordance with the disclosure are explained below based on examples.

Example 1 is a sensor device, comprising: a current conductor configured to carry a measurement current; a magnetic field sensor chip having a sensor element, wherein the magnetic field sensor chip is configured to detect a magnetic field at the location of the sensor element; an encapsulation material, wherein the magnetic field sensor chip is encapsulated by the encapsulation material; and a soft magnet secured to the encapsulation material and configured to concentrate the magnetic field at the location of the sensor element, wherein the magnetic field sensor chip and the soft magnet are galvanically isolated from one another by the encapsulation material.

Example 2 is a sensor device according to example 1, furthermore comprising: a coil formed around the sensor element and configured to carry a compensation current, wherein a magnetic field induced by the compensation current compensates for a magnetic field induced by the measurement current at the location of the sensor element.

Example 3 is a sensor device according to example 2, wherein the compensation current is proportional to the measurement current and the sensor device is configured to determine the measurement current based on the compensation current.

Example 4 is a sensor device according to example 2 or 3, wherein the coil is formed in a metallization layer formed at a surface of the magnetic field sensor chip.

Example 5 is a sensor device according to any of the preceding examples, furthermore comprising: an electrically conductive chip carrier comprising at least one connection conductor and the current conductor in the form of a busbar, wherein the magnetic field sensor chip is arranged on the chip carrier and is electrically coupled to the at least one connection conductor.

Example 6 is a sensor device according to example 5 and any of examples 2 to 4, wherein the sensor element is arranged at a surface of the magnetic field sensor chip facing the electrically conductive chip carrier and the coil is formed in the electrically conductive chip carrier.

Example 7 is a sensor device according to any of the preceding examples, wherein the soft magnet comprises a polymer-based material and soft-magnetic filler particles embedded therein.

Example 8 is a sensor device according to any of the preceding examples, wherein the soft magnet is fabricated by means of a molding process.

Example 9 is a sensor device according to any of the preceding examples, wherein the soft magnet is secured to the encapsulation material by means of an adhesive material.

Example 10 is a sensor device according to any of the preceding examples, wherein the soft magnet is formed in a u-shaped fashion over three sides of the encapsulation material.

Example 11 is a sensor device according to any of examples 1 to 9, wherein the soft magnet is formed over a single side of the encapsulation material.

Example 12 is a sensor device according to any of the preceding examples, wherein the current conductor is encapsulated by the soft magnet.

Example 13 is a sensor device according to any of the preceding examples, wherein the current conductor is encapsulated by the encapsulation material.

Example 14 is a sensor device according to any of the preceding examples, wherein the encapsulation material is fabricated by means of a molding process.

Example 15 is a sensor device according to any of the preceding examples, wherein the encapsulation material comprises a conformal polymer-based coating formed on the magnetic field sensor chip.

Example 16 is a sensor device according to example 15, wherein the conformal polymer-based coating comprises parylene.

Example 17 is a sensor device according to any of the preceding examples, wherein the sensor element is configured to detect an absolute magnetic field strength of the magnetic field.

Example 18 is a method for producing a sensor device, wherein the method comprises: providing a current conductor configured to carry a measurement current; providing a magnetic field sensor chip having a sensor element, wherein the magnetic field sensor chip is configured to detect a magnetic field at the location of the sensor element; encapsulating the magnetic field sensor chip by an encapsulation material; and fabricating and securing a soft magnet to the encapsulation material, wherein the soft magnet is configured to concentrate the magnetic field at the location of the sensor element, wherein the magnetic field sensor chip and the soft magnet are galvanically isolated from one another by the encapsulation material.

Example 19 is a method according to example 18, wherein fabricating the soft magnet comprises at least one of the following: injection molding of a thermoplastic material, compression molding of a thermoplastic material, or transfer molding of a thermosetting plastic material.

Example 20 is a method according to example 18 or 19, wherein securing the soft magnet to the encapsulation material comprises: adhesively bonding the soft magnet to the encapsulation material.

Although specific embodiments have been illustrated and described herein, it is obvious to a person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A sensor device, comprising:
   a current conductor configured to carry a measurement current;
   a magnetic field sensor chip having a sensor element, wherein the magnetic field sensor chip is configured to detect a magnetic field at a location of the sensor element;
   an encapsulation material, wherein the magnetic field sensor chip is encapsulated by the encapsulation material; and
   a soft magnet secured to the encapsulation material and configured to concentrate the magnetic field at the location of the sensor element,
   wherein the magnetic field sensor chip and the soft magnet are galvanically isolated from one another by the encapsulation material.

2. The sensor device as claimed in claim 1, further comprising:
   a coil formed around the sensor element and configured to carry a compensation current, wherein a magnetic field induced by the compensation current compensates for a magnetic field induced by the measurement current at the location of the sensor element.

3. The sensor device as claimed in claim 2, wherein the compensation current is proportional to the measurement current and the sensor device is configured to determine the measurement current based on the compensation current.

4. The sensor device as claimed in claim 2, wherein the coil is formed in a metallization layer formed at a surface of the magnetic field sensor chip.

5. The sensor device as claimed in claim 1, further comprising:
   an electrically conductive chip carrier comprising at least one connection conductor and the current conductor in the form of a busbar,
   wherein the magnetic field sensor chip is arranged on the chip carrier and is electrically coupled to the at least one connection conductor.

6. The sensor device as claimed in claim 5, wherein the sensor element is arranged at a surface of the magnetic field sensor chip facing the electrically conductive chip carrier and a coil is formed in the electrically conductive chip carrier, wherein the coil is formed around the sensor element and configured to carry a compensation current.

7. The sensor device as claimed in claim 1, wherein the soft magnet comprises a polymer-based material and soft-magnetic filler particles embedded therein.

8. The sensor device as claimed in claim 1, wherein the soft magnet conforms to a shape of the encapsulation material.

9. The sensor device as claimed in claim 1, wherein the soft magnet is secured to the encapsulation material by means of an adhesive material.

10. The sensor device as claimed in claim 1, wherein the soft magnet is formed in a u-shaped fashion over three sides of the encapsulation material.

11. The sensor device as claimed in claim 1, wherein the soft magnet is formed over a single side of the encapsulation material.

12. The sensor device as claimed in claim 1, wherein the current conductor is encapsulated by the soft magnet.

13. The sensor device as claimed in claim 1, wherein the current conductor is encapsulated by the encapsulation material.

14. The sensor device as claimed in claim 1, wherein the encapsulation material is fabricated by means of a molding process.

15. The sensor device as claimed in claim 1, wherein the encapsulation material comprises a conformal polymer-based coating formed on the magnetic field sensor chip.

16. The sensor device as claimed in claim 15, wherein the conformal polymer-based coating comprises parylene.

17. The sensor device as claimed in claim 1, wherein the sensor element is configured to detect an absolute magnetic field strength of the magnetic field.

18. A method for producing a sensor device, wherein the method comprises:
    providing a current conductor configured to carry a measurement current;
    providing a magnetic field sensor chip having a sensor element, wherein the magnetic field sensor chip is configured to detect a magnetic field at a location of the sensor element;
    encapsulating the magnetic field sensor chip by an encapsulation material; and
    fabricating and securing a soft magnet to the encapsulation material, wherein the soft magnet is configured to concentrate the magnetic field at the location of the sensor element,
    wherein the magnetic field sensor chip and the soft magnet are galvanically isolated from one another by the encapsulation material.

19. The method as claimed in claim 18, wherein fabricating the soft magnet comprises at least one of the following:
    injection molding of a thermoplastic material,
    compression molding of a thermoplastic material, or
    transfer molding of a thermosetting plastic material.

20. The method as claimed in claim 18, wherein securing the soft magnet to the encapsulation material comprises:
    adhesively bonding the soft magnet to the encapsulation material.

* * * * *